(12) United States Patent
Miyauchi et al.

(10) Patent No.: US 7,869,165 B2
(45) Date of Patent: Jan. 11, 2011

(54) MAGNETIC FIELD DETECTING ELEMENT HAVING STACK WITH A PLURALITY OF FREE LAYERS AND SIDE SHIELD LAYERS

(75) Inventors: Daisuke Miyauchi, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 666 days.

(21) Appl. No.: 11/830,114

(22) Filed: Jul. 30, 2007

(65) Prior Publication Data
US 2009/0034132 A1 Feb. 5, 2009

(51) Int. Cl.
*G11B 5/39* (2006.01)
(52) U.S. Cl. .................................... 360/319
(58) Field of Classification Search ............. None
See application file for complete search history.

(56) References Cited

U.S. PATENT DOCUMENTS

| 6,914,759 | B2 | 7/2005 | Chen et al. | |
|---|---|---|---|---|
| 7,035,062 | B1 | 4/2006 | Mao et al. | |
| 7,333,304 | B2 * | 2/2008 | Gill et al. | 360/324.12 |
| 7,397,637 | B2 * | 7/2008 | Gill | 360/324.12 |
| 7,436,638 | B1 * | 10/2008 | Pan | 360/324.11 |
| 7,532,442 | B2 * | 5/2009 | Gill | 360/324.11 |
| 7,562,436 | B2 * | 7/2009 | Jayasekara | 29/603.13 |
| 7,639,456 | B2 * | 12/2009 | Hong et al. | 360/324.1 |

FOREIGN PATENT DOCUMENTS

| JP | 9-91624 | 4/1997 |
|---|---|---|
| JP | 2002-171013 | 6/2006 |

\* cited by examiner

*Primary Examiner*—Mark Blouin
(74) *Attorney, Agent, or Firm*—Knobbe Martens Olson & Bear LLP

(57) ABSTRACT

A magnetic field detecting element comprising: a stack including an upper magnetic layer, a lower magnetic layer and a non-magnetic intermediate layer sandwiched between said upper magnetic layer and said lower magnetic layer, wherein magnetization directions of said upper magnetic layer and said lower magnetic layer change in accordance with an external magnetic field; an upper shield electrode layer and a lower shield electrode layer which are provided in a manner that they sandwich said stack therebetween in a direction of stacking of said stack, wherein said upper shield electrode layer and said lower shield electrode layer supply sense current in the direction of stacking and magnetically shield said stack; a bias magnetic layer which is provided on a surface of said stack, the surface being opposite to an air bearing surface of said stack, wherein said bias magnetic layer applies a bias magnetic field to said upper magnetic layer and to said lower magnetic layer in a direction perpendicular to the air bearing surface; and a pair of side shield layers which are provided on both sides of said stack with regard to a track width direction.

12 Claims, 11 Drawing Sheets

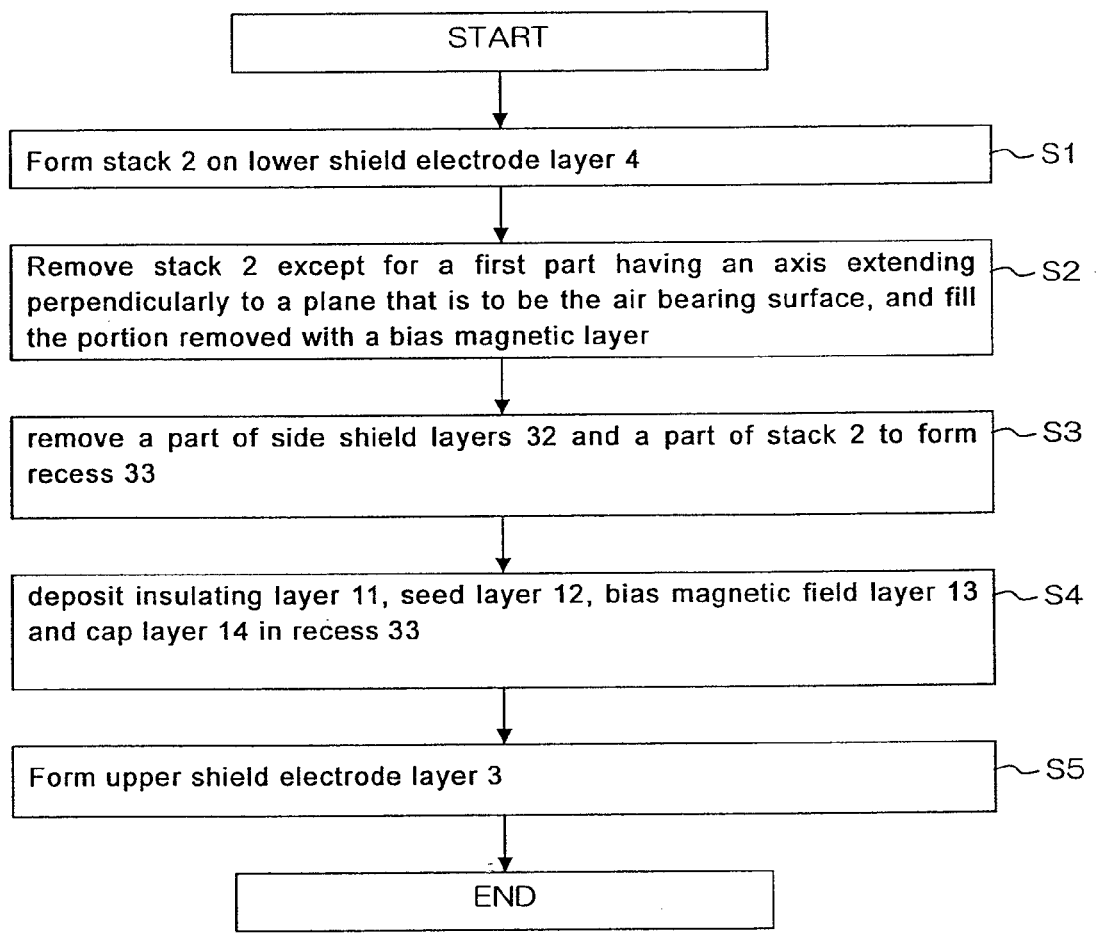

MAGNETIC FIELD DETECTING ELEMENT HAVING STACK WITH A PLURALITY OF FREE LAYERS AND SIDE SHIELD LAYERS

BACKGROUND OF THE INVENTION

1. Field of the Invention

The present invention relates to a magnetic field detecting element and a manufacturing method thereof, and more particularly, to the structure of a magnetic field detecting element having a plurality of free layers.

2. Description of the Conventional Art

As a reproduction element of a thin film magnetic head, GMR (Giant Magneto Resistance) elements are known. Hitherto, CIP (Current In Plane)-GMR element, in which sense current flows in a direction that is horizontal to the film surface of the element, have been mainly used. In recent years, however, in order to cope with higher density recording, elements have been developed in which sense current flows in a direction that is perpendicular to the film surface of the element. TMR elements utilizing the TMR (Tunnel Magneto-Resistance) effect, and CPP (Current Perpendicular to the Plane) elements utilizing the GMR effect are known as the elements of this type. In particular, the CPP element has high potential because it has low resistance as compared to the TMR element and because it exhibits high output even with a narrow track width as compared to the CIP element.

The CPP element includes a stack having a magnetic layer (free layer) whose magnetization direction changes in accordance with an external magnetic field, a magnetic layer (pinned layer) whose magnetization direction is fixed with respect to the external magnetic field, and a non-magnetic intermediate layer sandwiched between the pinned layer and the free layer. This stack is also called a spin-valve film. On both sides of the spin-valve film with regard to the track width direction, bias magnetic layers for applying a bias magnetic field to the free layer are provided. The free layer is magnetized into a single magnetic state by a bias magnetic field emitted from the bias magnetic layers. This provides an improvement in linearity of a change in resistance with respect to a change in an external magnetic field and an effective reduction in Barkhausen noise. A relative angle between the magnetization direction of the free layer and the magnetization direction of the pinned layer changes in accordance with an external magnetic field, and as a result, electric resistance of sense current that flows in a direction perpendicular to the film surface of the spin-valve film is changed. By making use of this property, external magnetization is detected. The spin-valve film is magnetically shielded by shield layers on both sides thereof with regard to the direction of stacking. The direction of stacking of the spin-valve film corresponds to the circumferential direction of a recording medium when a thin film magnetic head is incorporated into a hard disc drive. Therefore, the shield layers have a role of shielding a magnetic field emitted from adjacent bits on the same track of the recording medium.

In recent years, higher recording density is desired. However, an improvement in recording density requires an improvement in track recording density, which requires a reduction in spacing between upper and lower shield layers (a gap between shields). In order to achieve this, a decrease in thickness of the spin-valve film is required. However, there is large limitation that originates from the layer configuration in the conventional CPP elements. Specifically, since the pinned layer requires that the magnetization direction be firmly fixed without being influenced by an external magnetic field, a so-called synthetic pinned layer is usually used. The synthetic pinned layer includes an outer pinned layer, an inner pinned layer, and a non-magnetic intermediate layer which consists of Ru or Rh and which is sandwiched between the outer pinned layer and the inner pinned layer. Moreover, an anti-ferromagnetic layer is provided in contact with the outer pinned layer in order to fix the magnetization direction of the outer pinned layer. The antiferromagnetic layer typically consists of IrMn. In the synthetic pinned layer, the antiferromagnetic layer is coupled to the outer pinned layer via exchange-coupling so that the magnetization direction of the outer pinned layer is fixed. The inner pinned layer is antiferromagnetically coupled to the outer pinned layer via the non-magnetic intermediate layer so that the magnetization direction of the inner pinned layer is fixed. Since the magnetization directions of the inner pinned layer and the outer pinned layer are anti-parallel to each other, magnetization of the pinned layer is limited as a whole. Despite such a merit of the synthetic pinned layer, however, a large number of layers are required to constitute a CPP element that includes the synthetic pinned layer. This imposes limitation on a reduction in the thickness of the spin-valve film.

Meanwhile, a novel layer configuration that is entirely different from that of the above-mentioned conventional spin-valve film has been proposed in recent years. In "Current-in-Plane GMR Trilayer Head Design for Hard-Disk Drives" (IEEE TRANSACTIONS ON MAGNETICS, Vol. 43, No. 2, February 2007), a stack used for the CIP element, which includes two free layers and a non-magnetic intermediate layer that is sandwiched between the free layers, is disclosed. Each of the magnetization direction of the free layers changes in accordance with an external magnetic field. A bias magnetic layer is provided on the side of the stack opposite to the air bearing surface, and a bias magnetic field is applied in a direction that is perpendicular to the air bearing surface. The magnetization directions of the two free layers adopt a certain relative angle because of the magnetic field applied from the bias magnetic layer. If an external magnetic field is applied in this state, then the magnetization directions of two free layers are changed. As a result, the relative angle between the magnetization directions of the two free layers is changed, and accordingly, electric resistance of sense current is changed. By making use of such a property, it becomes possible to detect an external magnetic field. Moreover, in U.S. Pat. No. 7,035,062, an example is disclosed in which such a layer configuration is applied to the CPP element. Such a layer configuration using two free layers has a potential for facilitating a reduction in the gap between the shield layers, because it does not require the conventional synthetic pinned layer and the antiferromagnetic layer, allowing a simplified layer configuration.

However, in order to achieve high recording density, not only an improvement in recording density, but also narrow track width is required. A stack using two free layers facilitates a reduction in the gap between the shields. However, the configuration in the track width direction is the same as in the conventional CPP element, and therefore, the effective track width is the same as in the conventional art. Accordingly, there is limitation on higher recording density even if a layer configuration using two free layers is employed.

SUMMARY OF THE INVENTION

The present invention is directed to a CPP type magnetic field detecting element of a layer configuration including a stack having plural free layers, and provided with a bias magnetic field layer on the back side of the stack when viewed from a air bearing surface. One object of the present invention is to provide a magnetic field detecting element having the above-mentioned layer configuration that allows a reduction in the gap between the shields, as well as a reduction in an effective track width, thus obtaining high recording density. Another object of the present invention is to provide a method of manufacturing such a magnetic field detecting element.

According to an embodiment of the present invention, a magnetic field detecting element comprising: a stack including an upper magnetic layer, a lower magnetic layer and a non-magnetic intermediate layer sandwiched between said upper magnetic layer and said lower magnetic layer, wherein magnetization directions of said upper magnetic layer and said lower magnetic layer change in accordance with an external magnetic field; an upper shield electrode layer and a lower shield electrode layer which are provided in a manner that they sandwich said stack therebetween in a direction of stacking of said stack, wherein said upper shield electrode layer and said lower shield electrode layer supply sense current in the direction of stacking and magnetically shield said stack; a bias magnetic layer which is provided on a surface of said stack, the surface being opposite to an air bearing surface of said stack, wherein said bias magnetic layer applies a bias magnetic field to said upper magnetic layer and to said lower magnetic layer in a direction perpendicular to the air bearing surface; and a pair of side shield layers which are provided on both sides of said stack with regard to a track width direction.

In accordance with this structure, the need for providing an antiferromagnetic layer and a synthetic pinned layer in the stack is obviated, and a reduction in the stack thickness is facilitated. Therefore, a reduction in the gap between the shields can be achieved. Moreover, a pair of side shield layers are formed on both sides of the stack. Since the track width direction of the stack corresponds to the radial direction of a recording medium when a thin film magnetic head is incorporated into a hard disc drive, a magnetic field emitted from the adjacent tracks of the recording medium is shielded by the side shield layers. Therefore, a reduction in the effective track width, and thus, a reduction in spacing between the adjacent tracks can be achieved. In this way, it is possible to reduce both the pitch between adjacent bits on the same track and the pitch between tracks, and thereby to provide a magnetic field detecting element which is easy to cope with high recording density.

According to another embodiment of the present invention, a method of manufacturing a magnetic field detecting element, including the steps of: forming a stack on a lower shield electrode layer, wherein said stack includes a lower magnetic layer whose magnetization direction changes in accordance with an external magnetic field, a non-magnetic intermediate layer, and an upper magnetic layer whose magnetization direction changes in accordance with the external magnetic field, said lower magnetic layer, said non-magnetic intermediate layer, and said upper magnetic layer being stacked in this order; removing portions of said stack, said portions being on both sides with regard to a track width direction, and filling a part of said portions which are removed with side shield layers which include a soft magnetic layer; removing a part of said side shield layers and a part of said stack to form a recess which extends toward said stack while a width thereof in the track width direction decreases; filling a part of said recess with a bias magnetic layer; and forming an upper shield electrode layer on an upper side of said side shield layers and said bias magnetic layer.

The above and other objects, features and advantages of the present invention will become apparent from the following description with reference to the accompanying drawings which illustrate examples of the present invention.

BRIEF DESCRIPTION OF THE DRAWINGS

FIG. 4 is a flow chart explaining a method of manufacturing the magnetic field detecting element shown in FIG. 1;

DESCRIPTION OF THE PREFERRED EMBODIMENTS

Figure 1:
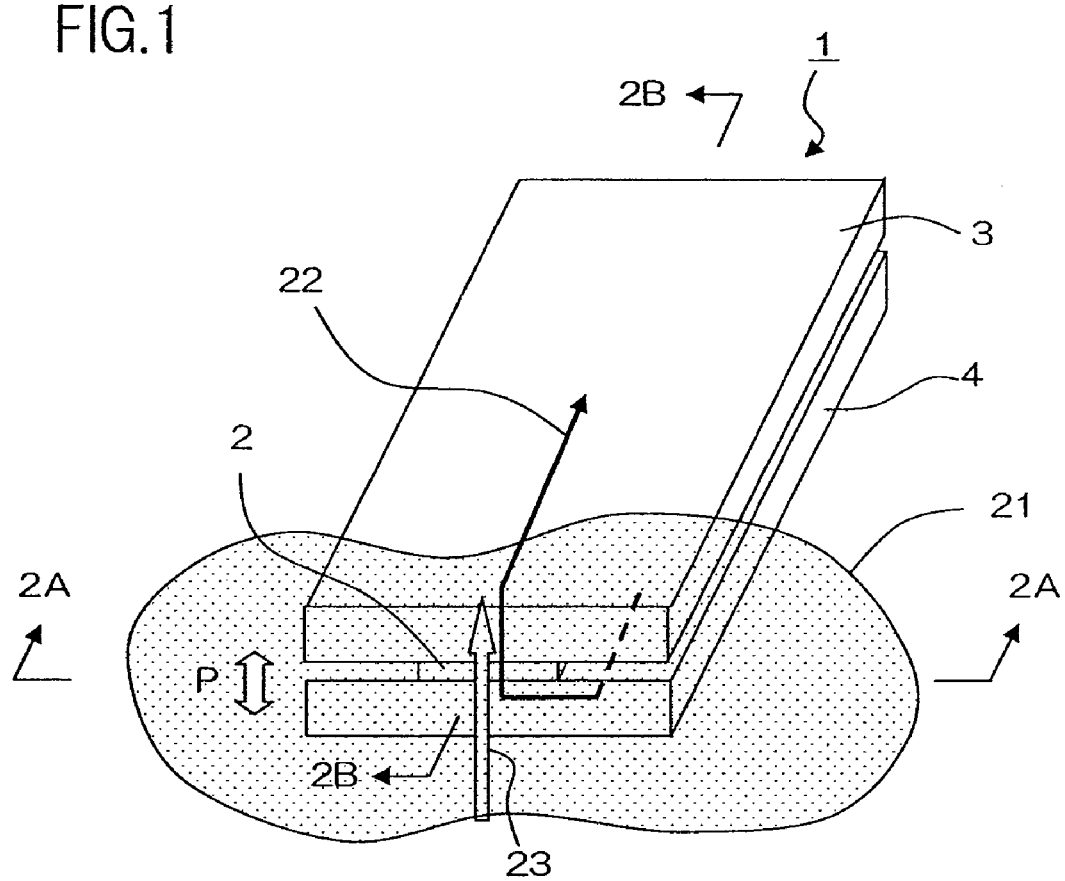
FIG. 1 is a conceptual perspective view of a magnetic field detecting element according to an embodiment of the present invention.
Figure 2A:
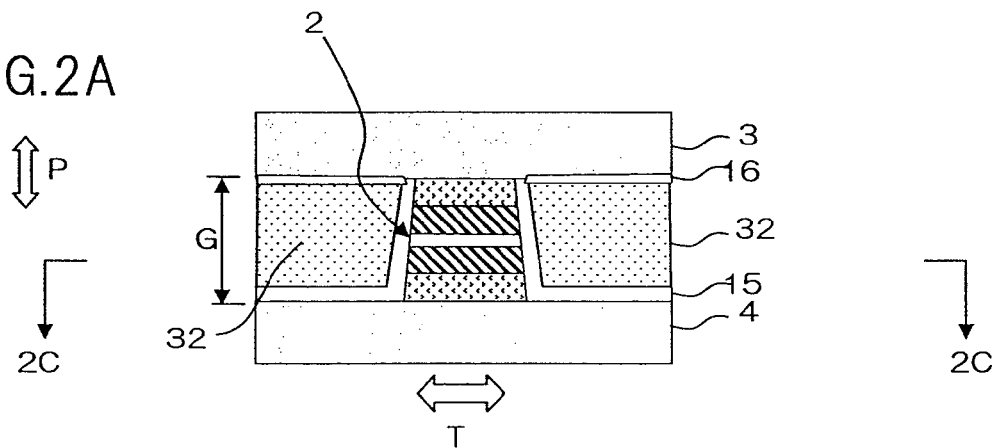
FIG. 2A is a cross sectional view of the magnetic field detecting element when viewed from 2A-2A direction of FIG. 1.
Figure 2B:
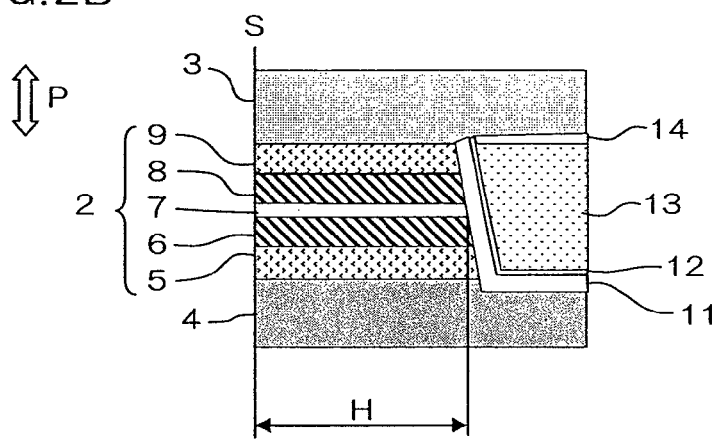
FIG. 2B is a cross sectional view of the magnetic field detecting element along 2B-2B line of FIG. 1.
Figure 2C:
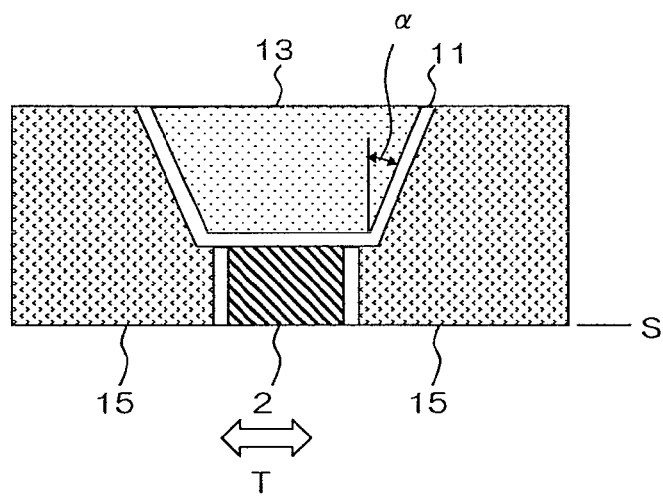
FIG. 2C is a cross sectional view along 2C-2C line of FIG. 2A.

An embodiment of the present invention will now be described with reference to the attached drawings. A magnetic field detecting element of the present embodiment is particularly suitable for use as a read head portion of a thin film magnetic head of a hard disc drive. FIG. 1 is a conceptual perspective view of a magnetic field detecting element of the present embodiment. FIG. 2A is a side view of the magnetic field detecting element when viewed from 2A-2A direction of FIG. 1, i.e., viewed from the air bearing surface. FIG. 2B is a cross sectional view of the magnetic field detecting element taken along 2B-2B line of FIG. 1. FIG. 2C is a cross sectional view of the magnetic field detecting element taken along 2C-2C line of FIG. 2A. The air bearing surface refers to the surface of magnetic field detecting element 1 that faces recording medium 21.

Magnetic field detecting element 1 includes stack 2, upper shield electrode layer 3 and lower shield electrode layer 4 which are provided such that they sandwich stack 2 in the direction of stacking, bias magnetic layer 13 provided on the surface of stack 2 that is opposite to air bearing surface S, and side shield layers 32 provided on both sides of stack 2 with regard to track width direction T.

Stack 2 is sandwiched between upper shield electrode layer 3 and lower shield electrode layer 4 with the tip end thereof exposed at air bearing surface S. Stack 2 is adapted such that sense current 22 is caused to flow in direction P that is perpendicular to the film surface when a voltage is applied between upper shield electrode layer 3 and lower shield electrode layer 4. Magnetic field of recording medium 21 at the position facing stack 2 changes in accordance with the movement of recording medium 21 in moving direction 23. The change in magnetic field is detected as a change in electric resistance which is caused by the magneto-resistance effect. Based on this principle, magnetic field detecting element 1 reads magnetic information that is recorded in each magnetic domain of recording medium 21.

An example of a layer configuration of stack 2 is shown in Table 1. In the table, the layers are shown in the order of stacking, from buffer layer 5 in the bottom column, which is on the side of lower shield electrode layer 4, toward cap layer 9 in the top column, which is on the side of upper shield electrode layer 3. In Table 1, the numerals in the row of "Composition" indicate atomic fractions of the elements. Stack 2 has the layer configuration having buffer layer 5, lower magnetic layer 6, conductive non-magnetic intermediate layer 7, upper magnetic layer 8, and cap layer 9, which are stacked in this order on lower shield electrode layer 4 that is made of an 80Ni20Fe layer having a thickness of about 1 μm.

TABLE 1

| Layer Configuration | Composition | Thickness(nm) |
|---|---|---|
| Cap Layer 9 | Ru | 10 |
| Upper Magnetic Layer 8 | Co70Fe30 | 1 |
| | Ni80Fe20 | 2.5 |
| | Co70Fe30 | 1 |
| Non-magnetic Intermediate Layer 7 | Cu | 1.3 |
| Lower Magnetic Layer 6 | Co70Fe30 | 1 |
| | Ni80Fe20 | 2.5 |
| | Co70Fe30 | 1 |
| Buffer Layer 5 | NiCr | 8 |
| | Ta | 1 |
| | (Total) | 29.3 |

Buffer layer 5 is provided as a seed layer for lower magnetic layer 6. Both lower magnetic layer 6 and upper magnetic layer 8, which have layer configurations in which a NiFe layer is sandwiched by CoFe layers, are magnetic layers whose magnetization directions are changed in accordance with an external magnetic field. Non-magnetic intermediate layer 7 is made of Cu. The thickness of the Cu layer of non-magnetic intermediate layer 7 is 1.3 nm. Cu exhibits the largest binding energy at this thickness, allowing lower magnetic layer 6 and upper magnetic layer 8 to be magnetically strongly coupled via antiferromagnetic coupling. By providing the CoFe layers in lower magnetic layer 6 and in upper magnetic layer 8, the spin polarization factor is increased at the interfaces of the Cu layer as compared to the layer configuration in which the Cu layer and the NiFe layer is in direct contact, and thus the magnetic resistance effect is enhanced. Instead of the layer configuration shown in Table. 1, a single layer configuration consisting of a Co70Fe30 layer may be used for lower magnetic layer 6 and/or upper magnetic layer 8. Cap layer 9 is provided to prevent deterioration of the layers formed beneath. On cap layer 9, upper shield electrode layer 3, which is made of a 80Ni20Fe layer having a thickness of about 1 μm, is formed.

Upper shield electrode layer 3 and lower shield electrode layer 4 function as electrodes for supplying sense current to stack 2 in direction of stacking P, and also function as shield layers for shielding a magnetic field emitted from adjacent bits on the same track of recording medium 21, as described above. Specifically, since direction of stacking P of stack 2 corresponds to the circumferential direction of recording medium 21 when the thin film magnetic head is incorporated into a hard disc drive, a magnetic field emitted from adjacent bits on the same track of recording medium 21 is shielded by upper shield layer 3 and lower shield layer 4.

An example of a layer configuration of the portion that is located on the back side of stack 2 when viewed from the air bearing surface is shown in Table 2. In the table, the layers are shown in the order of stacking, from insulating layer 11 in the bottom column toward cap layer 14 in the top column. In Table 2, the numerals in the row of "Composition" indicate atomic fractions of the elements. Bias magnetic layer 13 is provided such that it faces the surface of stack 2 that is opposite to air bearing surface S. Bias magnetic layer 13 applies a bias magnetic field to stack 2, particularly to upper magnetic layer 8 and lower magnetic layer 6, in a direction that is perpendicular to air bearing surface S. Bias magnetic layer 13 is formed on seed layer 12 in order to ensure good magnetic characteristics (high coercive force and rectangular ratio) as a bias magnetic layer. Insulating layer 11 consisting of an $Al_2O_3$ layer is formed between seed layer 12 and stack 2. As shown in FIG. 2B, insulating layer 11 is also formed on the side surface of stack 2 in order to prevent sense current 22 from flowing in bias magnetic layer 13. Cap layer 14 consisting of a Cr layer, an $Al_2O_3$ layer, and a Ti layer is provided on bias magnetic layer 13. Similarly to seed layer 12, the Cr layer is provided to ensure good magnetic characteristics. The $Al_2O_3$ layer is provided to prevent sense current 22 from flowing in bias magnetic layer 13. The Ti layer is provided to ensure sufficient contact of upper shield electrode layer 3.

TABLE 2

| Layer Configuration | Composition | Thickness(nm) |
|---|---|---|
| Cap Layer 14 | Ti | 1 |
| | $Al_2O_3$ | 7 |
| | Cr | 3 |
| Bias Magnetic Layer 13 | 80Co20Pt | 30 |
| Seed Layer 12 | Cr | 3 |
| Insulating Layer 11 | $Al_2O_3$ | 7 |

On both sides of stack 2 in track width direction T, a pair of side shield layers 32 are provided via insulating films 15 that consist of $Al_2O_3$. As described later, side shield layers 32 include a soft magnetic layer consisting of 80Ni20Fe. Insulating films 16 containing $Al_2O_3$ are also provided on side shield layers 32. The thickness of insulating films 15 is 5 nm, and the thickness of insulating films 16 is 5 nm. Insulating films 15, 16 serve to prevent sense current 22 from flowing in side shield layers 32. Similarly to upper shield layer 3 and lower shield layer 4, each side shield layer 32 has a role of shielding an external magnetic field. Specifically, since track width direction T of stack 2 corresponds to the radial direction of recording medium 21 when a thin film magnetic head is incorporated into a hard disc drive, a magnetic field emitted from adjacent tracks of recording medium 21 is shielded by the side shield layers 32.

In order to maintain the shielding effect of side shield layers 32, it is important that magnetic domains of side shield layers 32 are not unstabilized by an external magnetic field. In particular, it is important, in the present embodiment, to limit influence from bias magnetic layer 13 because bias magnetic layer 13 is arranged close to side shield layers 32. Referring to FIG. 2C, bias magnetic layer 13 extends toward stack 2 while the width thereof in track width direction T decreases. Specifically, bias magnetic layer 13 has a trapezoidal shape having a shorter side that is adjacent to stack 2, and the width of the shorter side is substantially corresponds to the width of stack 2 in track width direction T. Therefore, magnetic flux in bias magnetic layer 13 is gradually concentrated within the trapezoidal shape, and is efficiently applied to stack 2. In an example, angle α (see FIG. 2C) of the trapezoidal shape of bias magnetic layer 13 is about 20 degrees. In this way, in addition to effectively applying a bias magnetic field to stack 2, particularly to lower magnetic layer 6 and upper magnetic layer 8, it is possible to limit influence of a bias magnetic field on side shield layers 32.

Unstabilization of the magnetic domains of side shield layers 32 is also limited by the layer configuration of side shield layers 32 themselves. The layer configuration of side shield layer 32 is shown in Table 3-1. In the table, the layers are shown in the order of stacking, from the seed layer in the bottom column toward the cap layer in the top column. In the table, the numerals in the row of "Composition" indicate atomic fractions of the elements. The two shield layers are antiferromagnetically coupled via non-magnetic intermediate layer that consisting of Ru, and therefore, the magnetic domains of the shield layers are stabilized against an external magnetic field.

TABLE 3-1

| Layer Configuration | Composition | Thickness(nm) |
|---|---|---|
| Cap Layer | Ta | 4 |
| Shield Layer | 80Ni20Fe | 10 |
| Non-magnetic Intermediate Layer | Ru | 0.8 |
| Shield Layer | 80Ni20Fe | 10 |
| Seed Layer | Ta | 4 |

Another layer configuration of side shield layer 32 is shown in Table 3-2. In the table, the layers are shown in the order of stacking, from the seed layer in the bottom column toward the cap layer in the top column. In the table, the numerals in the row of "Composition" indicate atomic fractions of the elements. The shield layer is exchange-coupled to the antiferromagnetic layer that consists of IrMn, and therefore, the magnetic domains of the shield layers are stabilized against an external magnetic field.

TABLE 3-2

| Layer Configuration | Composition | Thickness(nm) |
|---|---|---|
| Cap Layer | Ta | 4 |
| Antiferromagnetic Layer | IrMn | 7 |
| Shield Layer | 80Ni20Fe | 13 |
| Seed Layer | Ta | 4 |

If unstabilization of the magnetic domains of side shield layers 32 can be sufficiently limited only by the configuration of bias magnetic layer 13, then it is possible to simplify the layer configuration of side shield layers 32. A simplified layer configuration of side shield layer 32 is shown in Table 3-3. In the table, the layers are shown in the order of stacking, from the seed layer in the bottom column toward the cap layer in the top column. In the table, the numerals in the row of "Composition" indicate atomic fractions of the elements. The main portion of side shield layer 32 is formed by a soft magnetic layer of 80NiFe20. By using side shield layers 32 of this embodiment, it is possible to simplify the manufacturing process and to reduce the manufacturing cost.

TABLE 3-3

| Layer Configuration | Composition | Thickness(nm) |
|---|---|---|
| Cap Layer | Ta | 4 |
| Shield Layer | 80Ni20Fe | 20 |
| Seed Layer | Ta | 4 |

Figure 3:
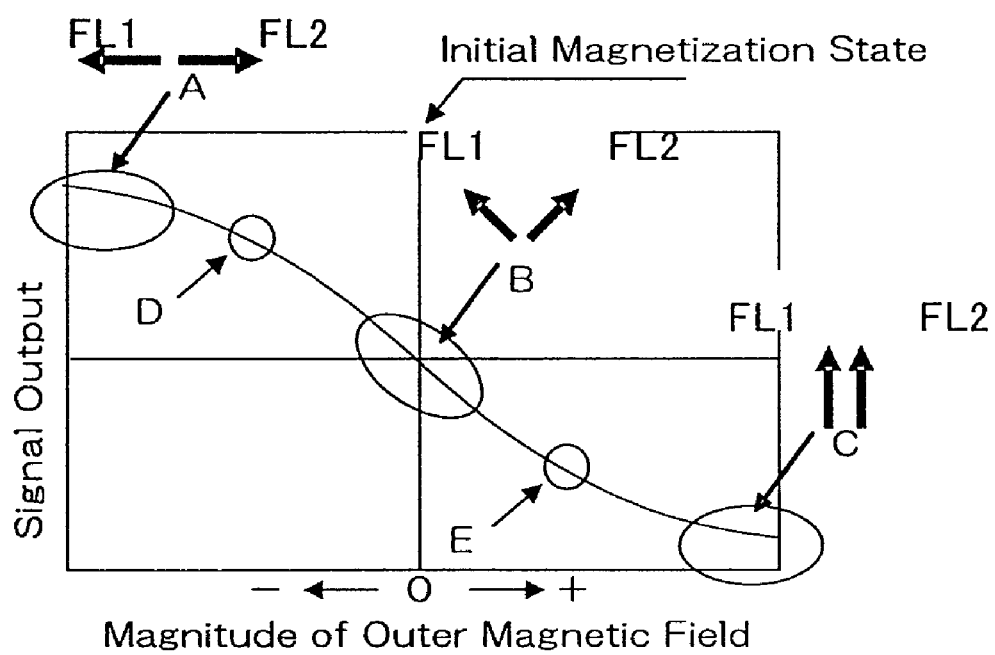
FIG. 3 is a conceptual view showing an operation principle of the magnetic field detecting element shown in FIG. 1.

FIG. 3 is a conceptual view showing the operation principle of the magnetic field detecting element of the present embodiment. The abscissa indicates magnitude of external magnetic field, and the ordinate indicates signal output. In the figure, the magnetization direction of upper magnetic layer 8 and the magnetization direction of lower magnetic layer 6 are indicated by FL1 and FL2, respectively. When neither a bias magnetic field emitted from bias magnetic layer 13 nor an external magnetic field emitted from recording medium 21 does not exist, the magnetization direction of upper magnetic layer 8 and the magnetization direction of lower magnetic layer 6 are anti-parallel to each other due to the above-described antiferromagnetic coupling (A in the figure). However, since a bias magnetic field is applied actually, the magnetization direction of upper magnetic layer 8 and the magnetization direction of lower magnetic layer 6 are rotated from the anti-parallel state toward a parallel state, reaching an intermediate state between the anti-parallel state and the parallel state at an initial magnetization state (the state in which only a bias magnetic field is applied) (B in the figure). When an external magnetic field is applied from recording medium 21 in this state, the relative angle between the magnetization direction of upper magnetic layer 8 and the magnetization direction of lower magnetic layer 6 increases (a state closer to the anti-parallel state) or decreases (a state closer to the parallel state) in accordance with the direction of the magnetic field. If the state comes close to the anti-parallel state, then electrons emitted from the electrode are apt to be scattered, leading to an increase in electric resistance of the sense current. If the state comes close to the parallel state, then electrons emitted from electrode are less apt to be scattered, leading to a decrease in the electric resistance of the sense current. In this way, by utilizing the change in the relative angle between the magnetization direction of upper magnetic layer 8 and the magnetization direction of lower magnetic layer 6, an external magnetic field can be detected.

In the present embodiment, as a result of adjusting the thickness, the configuration, etc. of bias magnetic layer 13, the magnetization direction of upper magnetic layer 8 and the magnetization direction of lower magnetic layer 6 are approximately perpendicular to each other in the initial magnetization state (B in FIG. 3). Because the magnetization directions are perpendicular to each other in the initial magnetization state, a large change in output against a change in an external magnetic field, and thus, a large change in magnetic resistance can be obtained, and good asymmetry can also be obtained. If the bias magnetic field is insufficient, then the initial magnetization state becomes close to the anti-parallel state (A in FIG. 3), leading to low output and large asymmetry. Similarly, if the bias magnetic field is excessive, then the initial magnetization state becomes close to the parallel state (C in FIG. 3), leading to low output and large asymmetry.

Upper shield electrode layer 3 and lower shield electrode layer 4 function as electrodes for applying sense current, as well as shield layers for shielding a magnetic field emitted from adjacent bits on the same track of recording medium 21. Namely, when magnetic field detecting element 1 is viewed from a recording medium, stack 2 is surrounded by upper shield layer 3 and lower shield layer 4, as shown in FIG. 2A. Thus, upper shield layer 3 and lower shield layer 4 define actual gap G between the shields of magnetic field detecting element 1.

Gap G between the shields is determined by the thickness of stack 2. In the magnetic field detecting element of the present embodiment, since the antiferromagnetic layer and the outer pinned layer become unnecessary, a significant reduction in thickness can be achieved as compared to the spin-valve film of the conventional CPP element. Moreover, effective track width W is reduced by the pair of side shield layers 32. Owing to these effects, both an improvement in track recording density and realization of narrow track can be achieved at the same time. Thus, it is possible to provide a magnetic field detecting element which can achieve a large improvement in aerial recording density. Moreover, in the conventional CPP elements, only the inner pinned layer of the synthetic pinned layer directly contributes to a change in magnetic resistance. The outer pinned layer and the antiferromagnetic layer do not contribute to a change in magnetic resistance, but rather constitutes a cause that obstructs improvement in the magnetic resistance ratio. However, in the present embodiment, since the outer pinned layer and the antiferromagnetic layer are unnecessary, and therefore, parasitic resistance is decreased, there is large potential of further improvement in the magnetic resistance ratio.

Figure 5A:
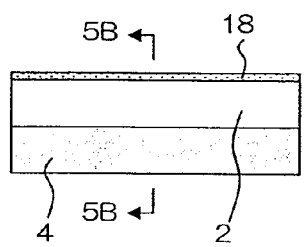
FIGS. 5A to 11C are step diagrams explaining the method of manufacturing the magnetic field detecting element shown in FIG. 1.
Figure 5B:
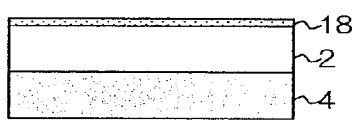
Figure 5C:
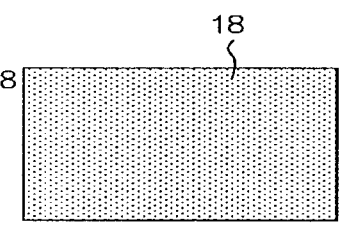
Figure 6A:
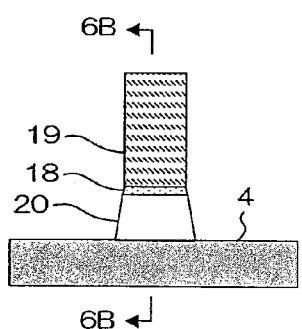

A method of manufacturing the above-mentioned magnetic field detecting element will now be described with reference to the flowchart of FIG. 4 and FIGS. 5A to 11C. FIGS. 5A, 6A ... 11A show cross sectional views of a wafer that is cut along a plane that is to be an air bearing surface, FIGS. 5B, 6B ... 11B show cross sectional views of the wafer that is cut along a plane that is perpendicular to a plane that is to be an air bearing surface, and FIGS. 5C, 6C, ..., 11C are top views of the wafer. Positions of cross sections in FIGS. 5B, 6B, ..., 11B are shown in FIGS. 5A, 6A, ..., 11A, respectively.

(Step S1) First, lower shield electrode layer 4 is prepared by the plating process. Next, as shown in FIGS. 5A to 5C, stack 2 is formed on lower shield electrode layer 4 by sputtering (stack forming step). As described above, stack 2 includes lower magnetic layer 6 whose magnetization direction changes in accordance with an external magnetic field, conductive non-magnetic intermediate layer 7 and upper magnetic layer 8 whose magnetization direction changes in accordance with an external magnetic field. Lower magnetic layer 6 on the lower side with regard to the direction of stacking, non-magnetic intermediate layer 7 and upper magnetic layer 8 on the upper side with regard to the direction of stacking are included in stack 2 in this order. Stack 2, which includes cap layer 9 consisting of a Ru layer, further includes Ta layer 18 (thickness 2 nm) when deposition is conducted. Ta layer 18 is formed on the Ru layer as part of cap layer 9. Ta layer 18 functions as a protective layer of stack 2 when planarizing insulating films 16 at a subsequent step.

Figure 6B:
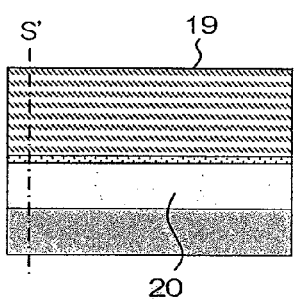
Figure 6C:
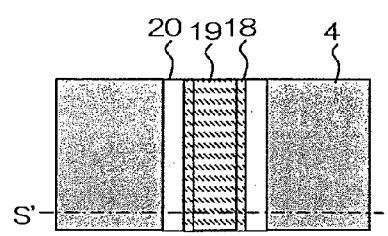
Figure 12:
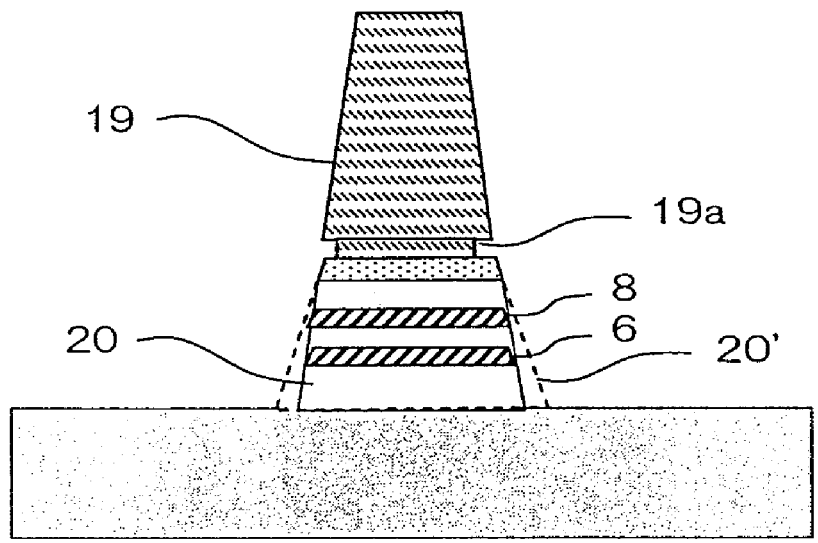
FIG. 12 is a cross sectional view of resist having an undercut.

(Step S2) Next, stack 2 is removed except for a first part having an axis extending perpendicularly to a plane that is to be the air bearing surface, and the portion removed is filled with a bias magnetic layer (bias magnetic layer forming step). Specifically, as shown in FIGS. 6A to 6C, resist 19 is deposited on Ta layer 18, is then formed in a predetermined shape. Next, using resist 19 as a mask, stack 2 is removed except for elongated first part 20 extending perpendicular to plane S' that is to be the air bearing surface. Resist 19 preferably does not have an undercut. FIG. 12 shows a cross sectional view of resist including an undercut. If undercut 19a is included, it is difficult for stack 2 to be formed in a steep shape by means of milling. As a result, first part 20' having a cross section in which a ratio of the lower side to the upper side is increased is apt to be formed, as shown by the broken lines in the figure. Conventionally, resist having an undercut may be formed taking into consideration facilitation of lift-off. However, in the present embodiment, resist shape which does not include such an undercut is used so that lower magnetic layer 6 and upper magnetic layer 8 are formed in the same shape as much as possible. If they are formed in the same shape, then the same magnetic characteristics can be obtained. This is desirable for performance as a magnetic field detecting element.

Figure 7A:
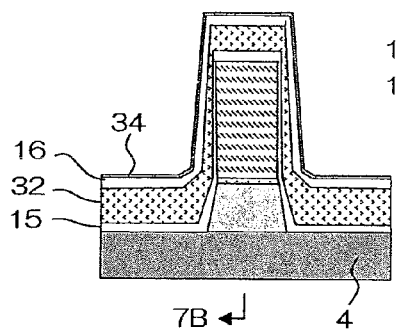
Figure 7B:
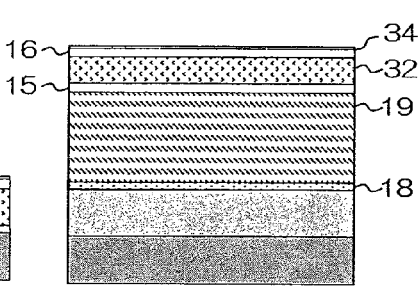
Figure 7C:
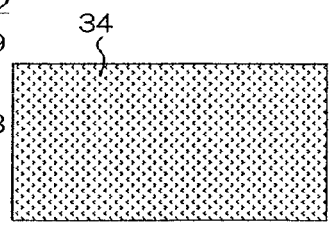
Figure 8A:
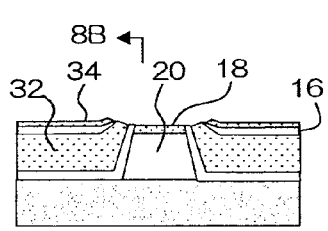
Figure 8B:
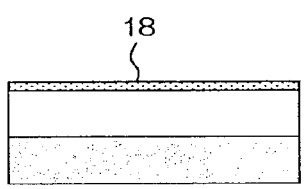
Figure 8C:
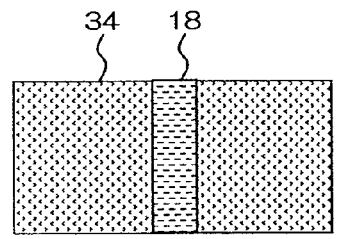

Thereafter, as shown in FIGS. 7A to 7C, insulating film 15 consisting of $Al_2O_3$, side shield layer 32 and insulating film 16 consisting of $Al_2O_3$ are deposited on resist 19 and lower shield electrode 4. Thereafter, Ta layer 34 is deposited on insulating film 16. Further, as shown in FIGS. 8A to 8C, resist 19 is removed by the lift-off process together with insulating film 15, side shield layer 32, insulating film 16 and Ta layer 34 which are deposited over resist 19. It is preferable that side shield layers 32 and insulating films 16 be planarized so that they are flush with stack 2 (first part 20). One reason for the planarization is to form upper shield layer 3 in a planar shape at a subsequent step. Another reason is to remove burrs that may occur between resist 19 and the upper surface of side shield layers 32 and between resist 19 and the upper surface of insulating films 16 in the lift-off process. As described above, burrs tend to occur in the lift-off process as compared to the configuration in which undercut 19a is provided because no undercut 19a is provided in resist 19. The planarization may be performed by means of, e.g., the chemical mechanical polishing process (CMP process). Ta layers 18, 34, which are hard material, serve to protect stack 2 in polishing.

Figure 9A:
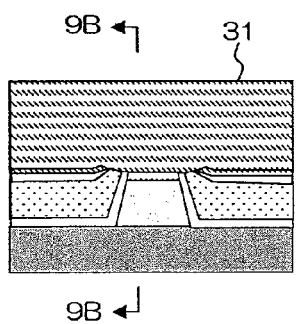
Figure 9B:
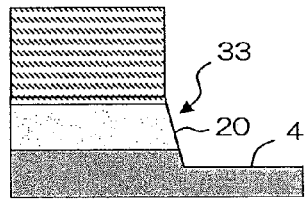
Figure 9C:
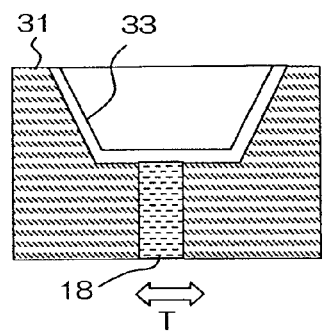

(Step S3) Next, as shown in FIGS. 9A to 9C, resist 31 is formed on Ta layers 18, 34, and is then formed in a predetermined shape. Thereafter, using resist 31 as a mask, a part of each side shield layer 32 and a part of stack 2 are removed to form recess 33. Recess 33 that is formed extends toward stack 2 while the width thereof in track width direction T decreases. In an actual process, recess 33 does not need to have an accurately trapezoidal shape, but may be rounded at corners. Resist 31 preferably does not include an undercut, similarly to resist 19. The reason is the same as in the case of resist 19. As a result, three sides of stack 2, which are both sides of stack 2 with regard to the track width direction and the surface that is opposite to air bearing surface S, are formed in steep shapes. Since bias magnetic layer 13 is formed in recess 33, as described later, a part of lower shield electrode 4 may be removed by means of milling if there is a need to ensure the thickness of bias magnetic layer 13.

Figure 10A:
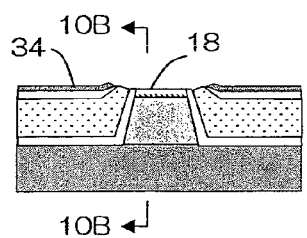
Figure 10B:
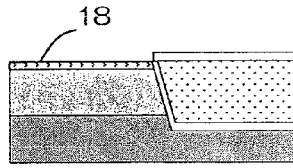
Figure 10C:
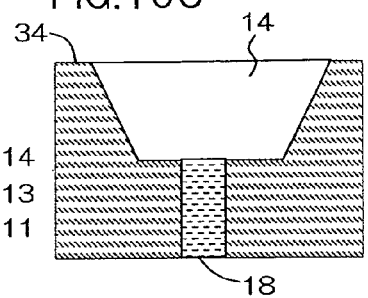

(Step S4) Next, as shown in FIGS. 10A to 10C, insulating layer 11, seed layer 12, bias magnetic field layer 13 and cap layer 14 are deposited in recess 33 (seed layer 12 is not illustrated). Insulating layer 11 and seed layer 12 are formed by means of the ion-beam sputtering process. Insulating layer 11 is deposited at a relatively low angle of about 40 degrees so that it is securely attached onto the side walls of stack 2 to ensure electric insulation. Instead of the ion beam sputtering process, low temperature CVD (Chemical Vapor Deposition) may also be used. The thickness of insulating layer 11 may be about 5 nm, but preferably is about 7 nm in order to ensure insulating properties. After depositing the layers up to cap layer 14, resist 31 is removed by the lift-off process. After removing resist 31, burrs are removed by extremely light CMP to planarize the surface.

Figure 11A:
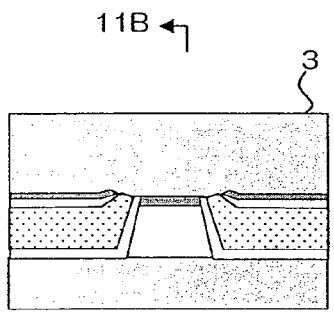
Figure 11B:
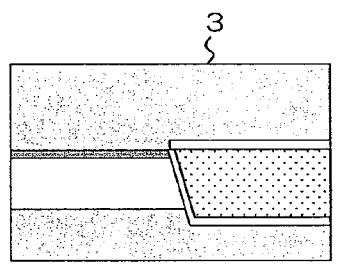
Figure 11C:
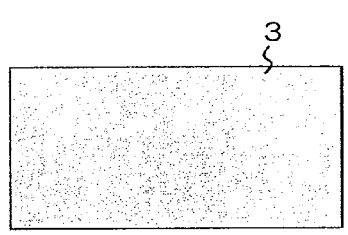

(Step S5) Next, after Ta layers 18, 34 are removed by sputter-etching, upper shield electrode layer 3 is formed on stack 2, insulating films 16 and cap layer 14, as shown in FIGS. 11A to 11C. Specifically, an electrode film, not shown, having a thickness of about 50 nm is formed by the sputtering process, and upper shield electrode layer 3 is then formed thereon by the plating process.

Thereafter, a write head portion is formed, the wafer is then diced into bars, and the air bearing surface is formed by polishing. Further, each bar is separated into sliders, and the sliders are completed after undergoing processes, such as cleaning and inspections.

Next, the effect of the side shield layers will be described. In the following studies, the elements having the side shield layers of the layer configuration shown in Tables 3-1 to 3-3 are referred to as Examples 1 to 3, respectively, and the element having no side shield layers is referred to as Comparative Example 1. The same layer configuration as shown in Tables 1 and 2 in the above-mentioned embodiment was used for Examples 1 to 3 and Comparative Example 1, and the element size was set to 0.05 μm both in the track width direction and in the MR height direction. The manufacturing process of Comparative Example 1 was similar to that of Examples 1 to 3, except that insulating films consisting of $Al_2O_3$ were formed instead of the side shield layers and that the insulating films were planarized by means of the CMP process. In Examples 1 to 3 and Comparative Example 1, a CoPt film having a thickness of 30 nm was formed as the bias magnetic layer, via a $Al_2O_3$ film having a thickness of 7 nm and a Cr seed layer having a thickness film of 3 nm, on the side of stack 2 (or the spin-valve film) that is to be the back side when viewed from the air bearing surface The results are shown in Table 4. The element resistance was found to be 20Ω in all cases, and the magneto resistance ratio was found to be 4.7% in all cases. The optical track width was defined as an average value of the width of the upper magnetic layer and the width of the lower magnetic layer measured in the track width direction. The effective track width was defined as a half-value of a micro-track profile (a profile of output that is obtained by scanning a micro-track, which has a sufficiently narrower track width than the track width, in the track width direction). The occurrence rate of the Barkhausen noise was normalized by the value of Example 1. Although the optical track width is the same in each Example and in Comparative Example, the effective track width is decreased in each Example as compared to that in Comparative Example due to the effect of the side shield layers. The Barkhausen noise tends to occur more frequently in the case of the side shield layers having a configuration of a single soft magnetic layer (Example 3). It is considered that this is because magnetic domains of the side shield layers are slightly unstable and the noise is apt to occur. However, the effective track width is smaller than in other examples. It is possible to select a suitable layer configuration among Examples 1 to 3 in accordance with the specification required as the magnetic head.

TABLE 4

| | MRR (Ω) | Output (mV) | Optical Track Width (nm) | Effective Track Width (nm) | Occurrence Rate of Barkhausen Noise (normalized) |
|---|---|---|---|---|---|
| Example 1 | 20 | 1 | 5 | 5.5 | 1 |
| Example 2 | 20 | 1 | 5 | 5.4 | 1 |
| Example 3 | 20 | 1 | 5 | 5.2 | 1.1 |
| Comparative Example 1 | 20 | 1 | 5 | 6 | 1 |

Figure 13:
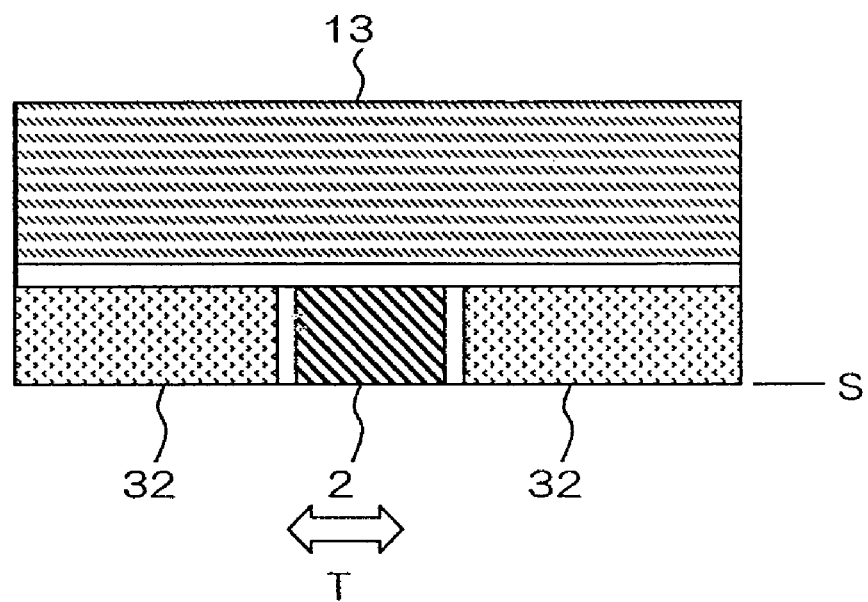
FIG. 13 is a cross sectional view showing the configuration of the bias magnetic layers of Comparative Example 2.

Next, the influence of the shape of the bias magnetic layer on the effective track width was studied. In the following study, the layer configurations in which bias magnetic layer 13 extends as far as the front of side shield layers 32 are referred to as Comparative Examples 2-1 to 2-3. In these Comparative Examples, side shield layers 32 are apt to be subject to a larger bias magnetic field. The layer configurations of side shield layers 32 of Comparative Examples 2-1 to 2-3 correspond to that of Examples 1 to 3, respectively. FIG. 13 is a cross sectional view of the magnetic field detecting element of Comparative Example 2 which is cut at the elevation of the stack. The height of side shield layers 32 measured in the direction that is perpendicular to air bearing surface S is the same as the height of stack 2. Bias magnetic layer 13 extends on the backside of side shield layers 32.

The results are shown in Table 5. Element resistance was found to be 20Ω in all cases, and magnetic resistance ratio was found to be 4.7% in all cases. When the bias magnetic layer extends as far as the front of the side shield layers, irrespective of the layer configuration of side shield layer 32, a large bias magnetic field is applied to the side shield layers and the magnetization direction thereof is oriented toward a direction that is perpendicular to the air bearing surface. Accordingly, the function as a shield layer to absorb a magnetic flux of adjacent tracks is lost and the effective track width is increased. Thus, it was confirmed that the configuration in which the bias magnetic layer is located only in front of the stack and is not located in front of the side shield layers is advantageous.

TABLE 5

| | MRR (Ω) | Output (mV) | Optical Track Width (nm) | Effective Track Width (nm) | Remark |
|---|---|---|---|---|---|
| Example 1 | 20 | 1 | 5 | 5.5 | Synthetic Layer |
| Comparative Example 2-1 | 20 | 1 | 5 | 5.9 | |
| Example 2 | 20 | 1 | 5 | 5.4 | with Antiferromagnetic Layer |
| Comparative Example 2-2 | 20 | 1 | 5 | 5.8 | |
| Example 3 | 20 | 1 | 5 | 5.2 | Single Soft Magnetic Layer |
| Comparative Example 2-3 | 20 | 1 | 5 | 5.7 | |

Figure 14:
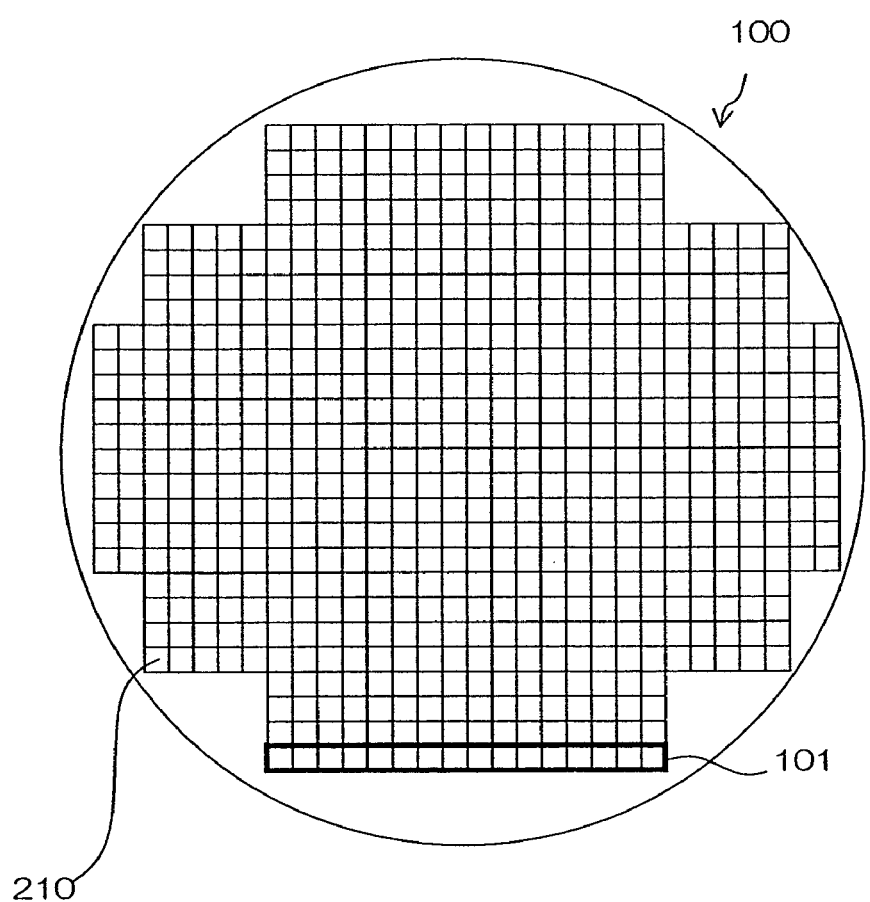
FIG. 14 is a plan view of a wafer which is used to manufacture the magnetic field detecting element of the present invention.

Next, explanation will be made regarding a wafer for fabricating a magnetic field detecting element described above. FIG. 14 is a schematic plan view of a wafer. Wafer 100 has a stack which is deposited thereon to form at least the magnetic field detecting element. Wafer 100 is diced into bars 101 which serve as working units in the process of forming air bearing surface ABS. After lapping, bar 101 is diced into sliders 210 which include thin-film magnetic heads. Dicing portions, not shown, are provided in wafer 100 in order to dice wafer 100 into bars 101 and into sliders 210.

Figure 15:
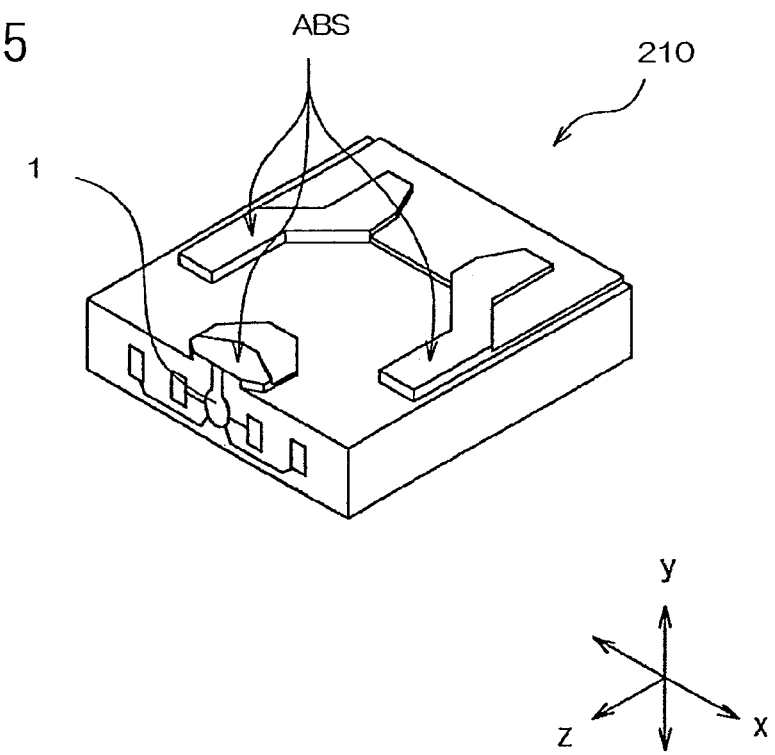
FIG. 15 is a perspective view of a slider of the present invention.

Referring to FIG. 15, slider 210 has a substantially hexahedral shape. One of the six surfaces of slider 210 forms air bearing surface ABS, which is positioned opposite to the hard disk.

Figure 16:
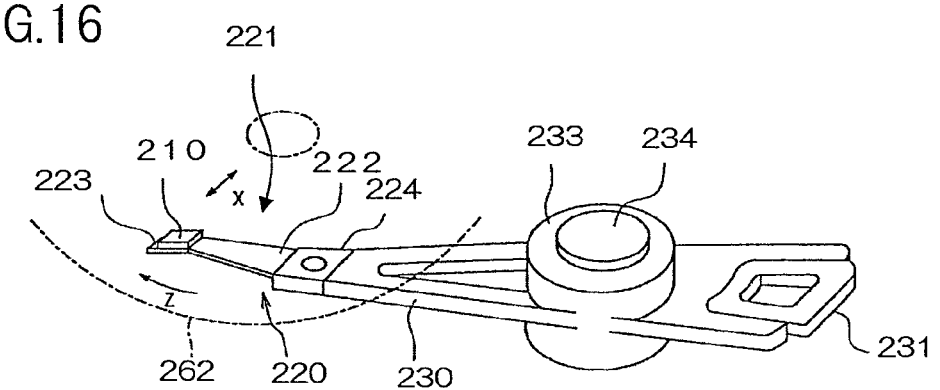
FIG. 16 is a perspective view of a head arm assembly which includes a head gimbal assembly which incorporates a slider of the present invention.

Referring to FIG. 16, head gimbal assembly 220 has slider 210 and suspension 221 for resiliently supporting slider 210. Suspension 221 has load beam 222 in the shape of a flat spring and made of, for example, stainless steel, flexure 223 that is attached to one end of load beam 222, and base plate 224 provided on the other end of load beam 222. Slider 210 is fixed to flexure 223 to provide slider 210 with an appropriate degree of freedom. The portion of flexure 223 to which slider 210 is attached has a gimbal section for maintaining slider 210 in a fixed orientation.

Slider 210 is arranged opposite to a hard disk, which is a rotationally-driven disc-shaped storage medium, in a hard disk drive. When the hard disk rotates in the z direction shown in FIG. 16, airflow which passes between the hard disk and slider 210 creates a dynamic lift, which is applied to slider 210 downward in the y direction. Slider 210 is configured to lift up from the surface of the hard disk due to this dynamic lift effect. Magnetic field detecting element 1 is formed in proximity to the trailing edge (the end portion at the lower left in FIG. 15) of slider 210, which is on the outlet side of the airflow.

The arrangement in which a head gimbal assembly 220 is attached to arm 230 is called a head arm assembly 221. Arm 230 moves slider 210 in transverse direction x with regard to the track of hard disk 262. One end of arm 230 is attached to base plate 224. Coil 231, which constitutes a part of a voice coil motor, is attached to the other end of arm 230. Bearing section 233 is provided in the intermediate portion of arm 230. Arm 230 is rotatably held by shaft 234 which is attached to bearing section 233. Arm 230 and the voice coil motor to drive arm 230 constitute an actuator.

Figure 17:
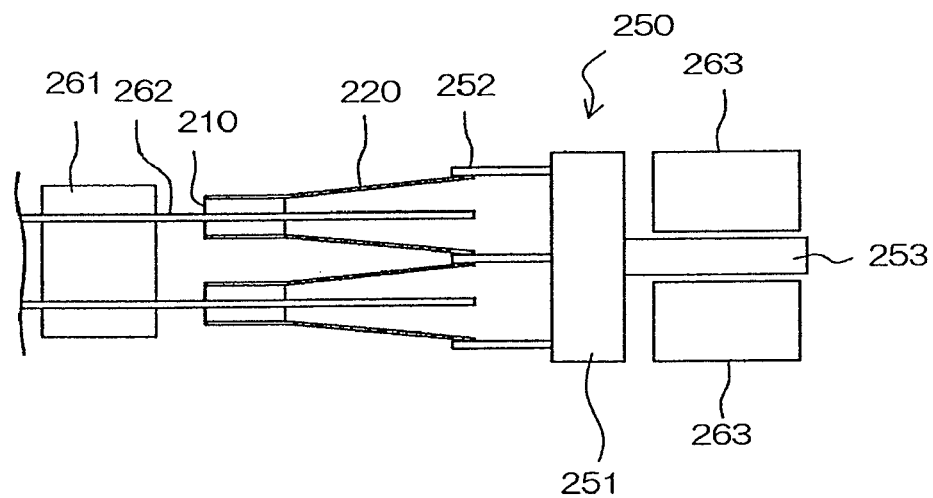
FIG. 17 is a side view of a head arm assembly which incorporates sliders of the present invention.
Figure 18:
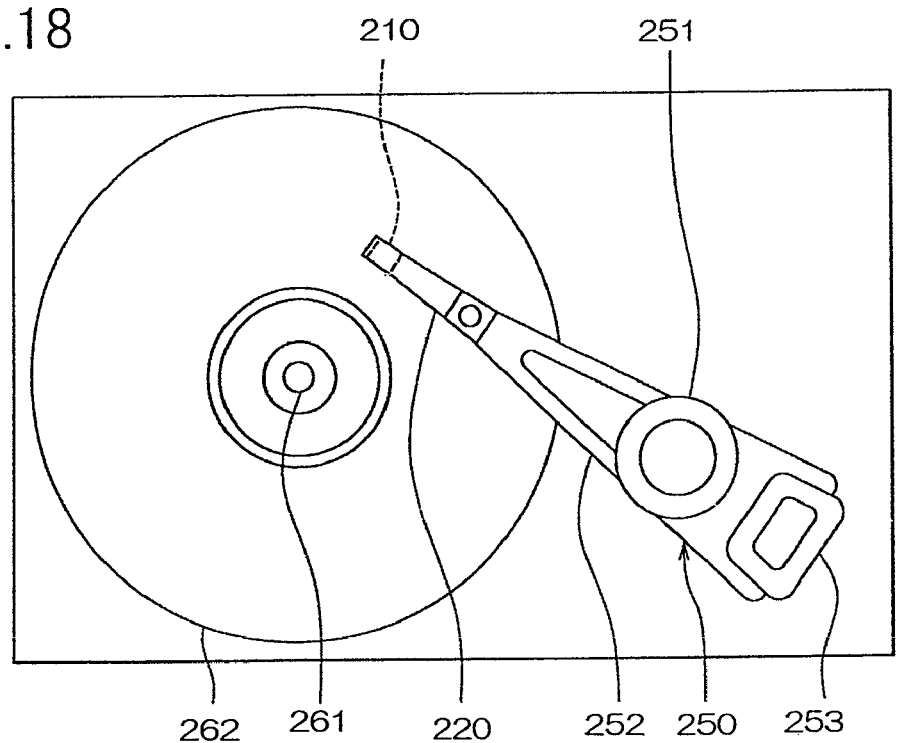
FIG. 18 is a plan view of a hard disk drive which incorporates sliders of the present invention.

Referring to FIG. 17 and FIG. 18, a head stack assembly and a hard disk drive that incorporate the slider mentioned above will be explained next. The arrangement in which head gimbal assemblies 220 are attached to the respective arm of a carriage having a plurality of arms is called a head stack assembly. FIG. 17 is a side view of a head stack assembly, and FIG. 18 is a plan view of a hard disk drive. Head stack assembly 250 has carriage 251 provided with a plurality of arms 252. Head gimbal assemblies 220 are attached to arms 252 such that head gimbal assemblies 220 are arranged apart from each other in the vertical direction. Coil 253, which constitutes a part of the voice coil motor, is attached to carriage 251 on the side opposite to arms 252. The voice coil motor has permanent magnets 263 which are arranged in positions that are opposite to each other and interpose coil 253 therebetween.

Referring to FIG. 18, head stack assembly 250 is installed in a hard disk drive. The hard disk drive has a plurality of hard disks which are connected to spindle motor 261. Two sliders 210 are provided per each hard disk 262 at positions which are opposite to each other and interpose hard disk 262 therebetween. Head stack assembly 250 and the actuator, except for sliders 210, work as a positioning device in the present invention. They carry sliders 210 and work to position sliders 210 relative to hard disks 262. Sliders 210 are moved by the actuator in the transverse direction with regard to the tracks of hard disks 262, and positioned relative to hard disks 262. Magnetic field detecting element 1 that is included in slider 210 writes information to hard disk 262 by means of the write head portion, and reads information recorded in hard disk 262 by means of the read head portion.

Although certain preferred embodiments of the present invention have been shown and described in detail, it should be understood that various changes and modifications may be made without departing from the spirit or scope of the appended claims.

The invention claimed is:

1. A magnetic field detecting element comprising:
a stack including an upper magnetic layer, a lower magnetic layer and a non-magnetic intermediate layer sandwiched between said upper magnetic layer and said lower magnetic layer, wherein magnetization directions of said upper magnetic layer and said lower magnetic layer change in accordance with an external magnetic field;
an upper shield electrode layer and a lower shield electrode layer which are provided in a manner that they sandwich said stack therebetween in a direction of stacking of said stack, wherein said upper shield electrode layer and said lower shield electrode layer supply sense current in the direction of stacking and magnetically shield said stack;
a bias magnetic layer which is provided on a surface of said stack, the surface being opposite to an air bearing surface of said stack, wherein said bias magnetic layer applies a bias magnetic field to said upper magnetic layer and to said lower magnetic layer in a direction perpendicular to the air bearing surface; and
a pair of side shield layers which are provided on both sides of said stack with regard to a track width direction
wherein each of the pair of side shield layers includes a pair of soft magnetic layers which are antiferromagnetically coupled to each other via a non-magnetic intermediate layer.

2. The magnetic field detecting element according to claim 1, wherein each of the pair of side shield layers include a soft magnetic layer.

3. A magnetic field detecting element comprising:
a stack including an upper magnetic layer, a lower magnetic layer and a non-magnetic intermediate layer sandwiched between said upper magnetic layer and said lower magnetic layer, wherein magnetization directions of said upper magnetic layer and said lower magnetic layer change in accordance with an external magnetic field;
an upper shield electrode layer and a lower shield electrode layer which are provided in a manner that they sandwich said stack therebetween in a direction of stacking of said stack, wherein said upper shield electrode layer and said lower shield electrode layer supply sense current in the direction of stacking and magnetically shield said stack;
a bias magnetic layer which is provided on a surface of said stack, the surface being opposite to an air bearing surface of said stack, wherein said bias magnetic layer applies a bias magnetic field to said upper magnetic layer and to said lower magnetic layer in a direction perpendicular to the air bearing surface; and
a pair of side shield layers which are provided on both sides of said stack with regard to a track width direction,
wherein each of the pair of side shield layers includes a soft magnetic layer, and an antiferromagnetic layer which is exchange-coupled to said soft magnetic layer.

4. The magnetic field detecting element according to claim 1, wherein said bias magnetic layer extends toward said stack while a width thereof in the track width direction decreases.

5. The magnetic field detecting element according to claim 1, wherein the magnetization direction of said upper magnetic layer and the magnetization direction of said lower magnetic layer are approximately perpendicular to each other when no external magnetic field is applied.

6. The magnetic field detecting element according to claim 1, wherein said non-magnetic intermediate layer consists of copper and has a thickness of approximately 1.3 nm.

7. The magnetic field detecting element according to claim 1,
wherein insulating layers are provided between said stack and said bias magnetic layer, and between said stack and said pair of side shield layers, respectively.

8. A slider including the magnetic field detecting element according to claim 1.

9. A wafer having the stack that is to be formed into the magnetic field detecting element according to claim 1.

10. A head gimbal assembly including the slider according to claim 8, and a suspension for elastically supporting the slider.

11. A hard disc drive including the slider according to claim 8, and a device for supporting the slider and for positioning the slider with respect to a recording medium.

12. A method of manufacturing a magnetic field detecting element, including the steps of:
  forming a stack on a lower shield electrode layer, wherein said stack includes a lower magnetic layer whose magnetization direction changes in accordance with an external magnetic field, a non-magnetic intermediate layer, and an upper magnetic layer whose magnetization direction changes in accordance with the external magnetic field, said lower magnetic layer, said non-magnetic intermediate layer, and said upper magnetic layer being stacked in this order;
  removing portions of said stack, said portions being on both sides with regard to a track width direction, and filling a part of said portions which are removed with side shield layers which include a soft magnetic layer;
  removing a part of said side shield layers and a part of said stack to form a recess which extends toward said stack while a width thereof in the track width direction decreases;
  filling a part of said recess with a bias magnetic layer; and
  forming an upper shield electrode layer on an upper side of said side shield layers and said bias magnetic layer
  wherein each of the pair of side shield layers includes a pair of soft magnetic layers which are antiferromagnetically coupled to each other via a non-magnetic intermediate layer.

\* \* \* \* \*